United States Patent
Hussain et al.

(10) Patent No.: US 7,736,954 B2
(45) Date of Patent: Jun. 15, 2010

(54) METHODS FOR NANOSCALE FEATURE IMPRINT MOLDING

(75) Inventors: Muhammad Mustafa Hussain, Austin, TX (US); Naim Moumen, Walden, NY (US); Gabriel Gebara, Austin, TX (US); Ed Labelle, Austin, TX (US); Sidi Lanee, Austin, TX (US); Barry Sassman, Cedar Park, TX (US); Raj Jammy, Austin, TX (US)

(73) Assignee: Sematech, Inc., Austin, TX (US)

( * ) Notice: Subject to any disclaimer, the term of this patent is extended or adjusted under 35 U.S.C. 154(b) by 790 days.

(21) Appl. No.: 11/467,822

(22) Filed: Aug. 28, 2006

(65) Prior Publication Data

US 2010/0081278 A1   Apr. 1, 2010

Related U.S. Application Data

(60) Provisional application No. 60/711,830, filed on Aug. 26, 2005.

(51) Int. Cl.
   *H01L 21/84* (2006.01)
(52) U.S. Cl. .................. 438/149; 977/887; 977/888; 257/E21.561
(58) Field of Classification Search ......... 977/887–888; 438/149–166; 257/E21.561
   See application file for complete search history.

(56) References Cited

U.S. PATENT DOCUMENTS

| | | | | |
|---|---|---|---|---|
| 7,344,961 B2 * | 3/2008 | Romano et al. | ............ | 438/478 |
| 2007/0243655 A1 * | 10/2007 | Schmid et al. | ................ | 438/71 |

OTHER PUBLICATIONS

"Silicon Processing for the VLSI Era," vol. 1, 2000.
Cho et al., "Hf-silicate inter-poly dielectic technology for sub 70nm body tied FinFET flash memory," *2005 Symposium on VLSI Technology Digest of Technical Papers*, 208-209, 2005.
Liu et al., "Electron mobility in multi-FinFET with a (111) channel surface fabricated by orientation-dependent wet etching," *Microeletronic Engineering*, 80:390-393, 2005.
Oh et al., "Damascene gate FinFET SONOS memory implemented on bulk silicon wafer," *Electron Devices Meeting, IEDM Technical Digest, IEEE International*, 893-896, 2004.
Ohkura et al., Beam-induced seeded lateral epitaxy with suppressed impurity diffusion for a three-dimensional DRAM cell fabrication, *IEEE Transactions on Electron Devices*, 36:333-339, 1989.
Xiong et al., "Improvement of FinFET electrical characteristics by hydrogen annealing," *Electron Device Letters, IEEE*, 25:541-543, 2004.

* cited by examiner

*Primary Examiner*—Richard A. Booth
(74) *Attorney, Agent, or Firm*—Fulbright & Jaworski L.L.P.

(57) ABSTRACT

Methods for fabricating nanoscale features are disclosed. One technique involves depositing onto a substrate, where the first layer may be a silicon layer and may subsequently be etched. A second layer and third layer may be deposited on the etch first layer, followed by the deposition of a silicon cap. The second and third layer may be etched, exposing edges of the second and third layers. The cap and first layer may be removed and either the second or third layer may be etched, creating a nanoscale pattern.

20 Claims, 12 Drawing Sheets

METHODS FOR NANOSCALE FEATURE IMPRINT MOLDING

This application claims priority to, and incorporates by reference in their entirety, U.S. Provisional Patent Application No. 60/711,830 filed on Aug. 26, 2005.

BACKGROUND OF THE INVENTION

1. Field of the Invention

The present invention relates generally to nanofabrication techniques, and more particularly to a method for fabricating sub-50 nanometer imprint molds.

2. Description of Related Art

Advancements in nanotechnology have generated a need for fabrication of sub-50 nanometer (nm) structures and devices. Generally, techniques used for fabrication the sub-50 nanometer devices and structures include conventional top-down and bottom-up approaches. However, these approaches have significant limitation of patterning the fabricated feature with control.

As such, nanofabrication technique including, for example, nanoimprint lithography, has been used to produce high-throughput, controllable features. Nanoimprint lithography is a technique based on mechanical embossing, i.e., indirect pattern transfer on a target substrate or film. Nanoimprint lithography can give higher resolutions overcoming conventional lithographic light diffraction and beam scattering problems.

Generally, in nanoimprint lithography, a mold is made with the desired feature size and pattern on one side of the mold. The patterned side is subsequently embossed on a polymer coating over a target substrate. This is done under controlled temperature and pressure. After embossing, the mold is removed and the pattern is transferred onto a polymer. Next, a highly selective reactive ion etching is done to create a shallow trench, which eventually creates sub-50 nm features on the desired target.

However, the resolution of nanofabrication using the nanoimprint technique has numerous constraints. For example, fabricating masters with small features using conventional photolithography is not feasible due to the constraints of the wavelengths used. Additionally, problems such as the ability of a material to mold with high repeatability and efficiency may be lacking due to the nature of the materials used. Other examples of deficiencies of current techniques include the distortion of features in the transferred pattern, the swelling of the master by the monomers used or the solvent used to dissolve polymers, and the ability of a molded material to fill a mold completely.

Other techniques such as high resolution patterning are using electron or ion beam lithography, soft pattern transfer, microcontact printing, scanning probe lithography, edge lithography, or self-assembly for nanofabrication. However, all these techniques are still in research and development phases, and thus, may not be feasible for high throughput, commercial usage.

For example, in high-resolution electron or ion beam patterning, to increase resolution requires decreasing the diameter of particle beam, and thus, decreases the beam current. The changes to the particle beam increase the time necessary to achieve the same imaging dose.

Microcontact printing also has constraints such as failing to achieve the minimum size of features in stamps, lateral dimensions, and resolution of the transferred material. Additionally, the preferential adhesion of a printed material on a second surface uses current photolithography techniques, which may cause defects.

Scanning probe lithography is a serial writing process, which is inherently slow. Therefore, the use of scanning probe lithography is mostly research oriented. Also, scanning probe lithography is challenging to generate reproducible structures between scans because of variations in the surface topography of the substrate and differences in the shape of the tip.

Edge lithography can be limited in its ability to pattern arbitrary features due to the characteristics of light. Also, patterning intersecting lines of metal layers using edge lithography is method is a complicated, time consuming process.

Self-assembly techniques are currently unable to produce structures with precise spatial positioning and arbitrary shapes with a low concentration of defects and functionality. It is also unable to generate range patterns required for even simple electron functionality.

Any shortcoming mentioned above is not intended to be exhaustive, but rather is among many that tends to impair the effectiveness of previously known techniques for fabricating nanoscale features; however, shortcomings mentioned here are sufficient to demonstrate that the methodologies appearing in the art have not been satisfactory and that a significant need exists for the techniques described and claimed in this disclosure.

SUMMARY OF THE INVENTION

In one respect, a method for fabricating a nano-scale imprint mold is provided. A first film layer may be deposited on a substrate followed by the deposition of a second film layer. The deposition of the first and second film layer may be done using an atomic layer deposition technique. The method provides for creating trenches in the first and second layer using techniques, such as, but not limited to, photolithography.

After the trenches are formed, a etching process, either wet or dry, may be used to etch one of the film layers. The etching process creates vertical features of sub-100 nanometers, which may be used as an imprint mold.

In other respects, a method for fabricating a nano-scale imprint mold includes forming silicon pillars on a substrate. In one embodiment, a silicon layer may be formed on the substrate by etching process the silicon layer to expose a portion of the substrate. Next, a first film layer is deposited on the silicon pillars and the exposed substrate followed by the deposition of a second film layer. A cap layer, such as a silicon cap layer may be deposited on second film layer.

In order to expose the vertical edges of the first and second film layer, a process, such as a chemical mechanical polishing technique may be used. Once the edges are exposed, the cap and the silicon pillars may be removed. Next an etching process, including either a dry etch process or a wet etch process, may be used to etch either the first or second film layer to create a nano-scale pattern which may be used as an imprint mold.

In some respects, method for fabricating a nano-scale imprint mold includes depositing an insulation layer on a substrate followed by the deposition of a film layer and then a silicon layer. Next, the method provides steps for creating trenches in the film layer and the silicon layer. After the trenches are formed, an etching process may be used to etch the film layer to a desired pattern. Using the patterned film layer as a masking layer, the insulation layer and the substrate may subsequently be etch to create nanoscale features that can be used as an imprint mold.

Alternatively, in other respects, a method for fabricating a nano-scale imprint mold includes depositing a first film layer on a substrate. For example, an insulator layer may be deposited on to the substrate followed by the deposition of a silicon layer. Next, an etching process such as a hydroxide based etch chemistry may be used to etch the silicon layer, followed by etched, using dry or wet etch methods, of the first film layer, such that trenches in the etched first film layer may be formed.

In embodiments where a silicon-on-insulator (SOI) substrate is used, a first film layer may be deposited on the SOI substrate. Next, an etching process, dry or wet, may be used to etch the first film layer. Using the hydroxide base etch chemistry, the silicon of the SOI substrate may be etched, such that trenches in the etched first film layer may subsequently be formed.

The term "coupled" is defined as connected, although not necessarily directly, and not necessarily mechanically.

The terms "a" and "an" are defined as one or more unless this disclosure explicitly requires otherwise.

The term "substantially," "about," and its variations are defined as being largely but not necessarily wholly what is specified as understood by one of ordinary skill in the art, and in one-non and in one non-limiting embodiment the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The figures are examples only. They do not limit the scope of the invention.

DESCRIPTION OF ILLUSTRATIVE EMBODIMENTS

The disclosure and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present disclosure provides methods for fabricating nano-scale features. These techniques are simple, cost effective, reproducible, and may achieve a higher throughput. In one embodiment, the present disclosure provides techniques for fabricating nano-scale features including, without limitation, nano-imprinting mold, nano electronics (e.g., interconnection, FinFETS, cross bar arrays, memory, magnetic discs, patterned magnetic media, etc.), photonic devices (e.g., wave guides, grating, resonator, photonic crystal, diffractive optical elements, wave guide polarizers, etc.), biological applications (e.g., protein patterning, drug delivery, storage, etc.), fluidic applications (e.g., nano-fluidic devices, channels, storage, etc.), organic applications storage (e.g., organic thin film transistors, organic light emitting diodes, etc.), polymer devices, and nanoelectromechanical systems (NEMS). In other embodiments, the present techniques may be used to fabricate lateral and vertical nano wires.

Figure 1:
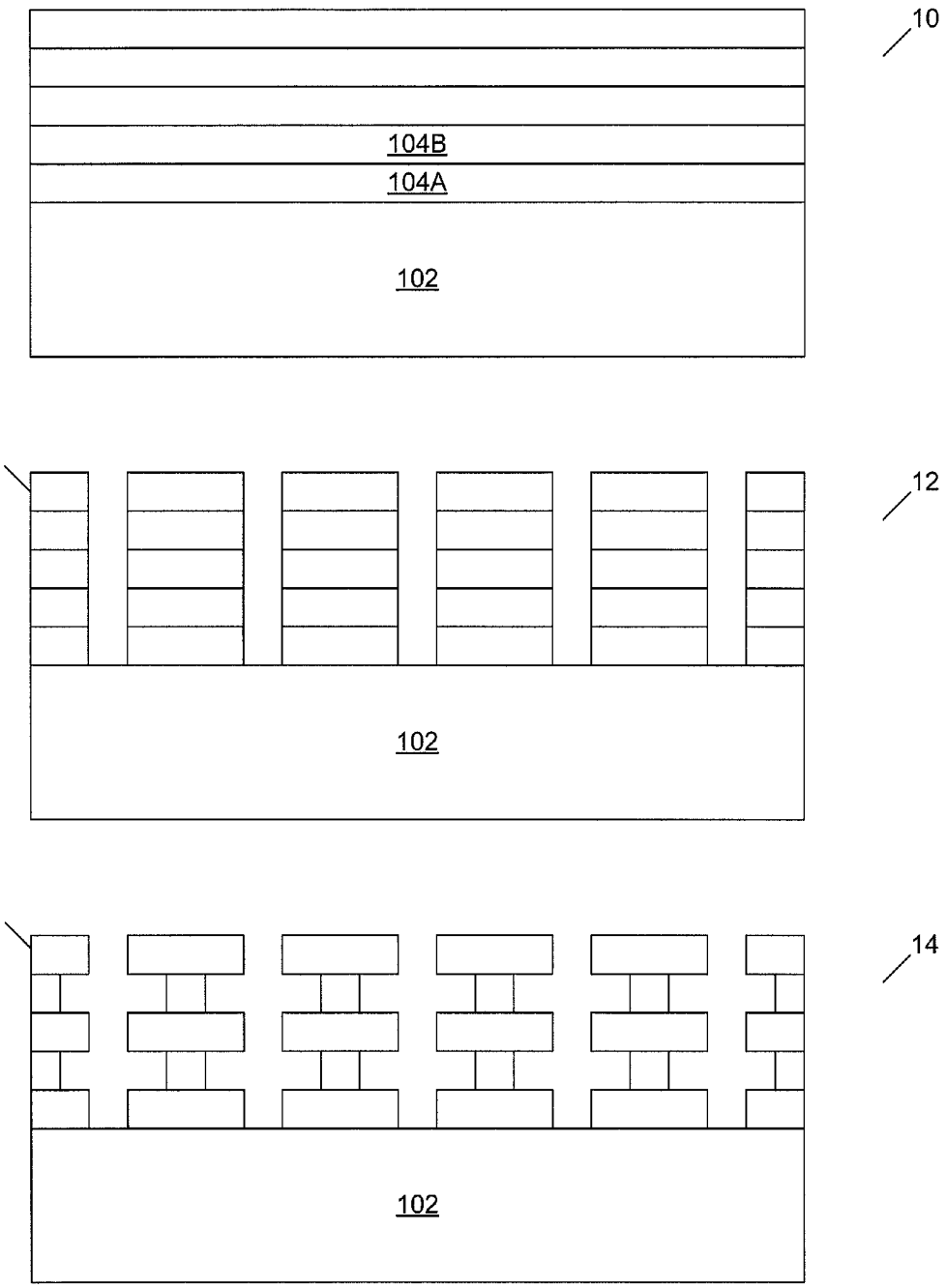
FIG. 1 is a flowchart of a method for fabricating nano features, in accordance with embodiments of this disclosure.

In one respect, referring to FIG. 1, a method for fabricating an imprinting mold is shown. In step 10, a plurality of film layers may be deposited on substrate 102 using, for example, an atomic layer deposition method. A first film layer 104A may be deposited, followed by second film layer 104B (collectively, alternate film layers 104). The deposition of film layer 104A and 104B may be continued until a desired film layer is achieved. For example, the film deposition thickness may depend on the mold pattern and the gaps needed. Additionally, the number of features and pitches may be considered.

In one embodiment first and second film layer 104A and 104B may include, without limitations, an atomic layer deposition titanium nitride (TiN), hafnium oxide ($HfO_2$), tantalum carbon nitride (TaCN), or an annealed hafnium silicate (HfSiO). In other embodiments, first film layer 104A may include either TiN or TaCN while 104B include either $HfO_2$ or HfSiO. The atomic layer deposition method may allow control over the thickness of the various film of layer 104. Additionally, the atomic layer deposition method allows for films to be deposited on an atomic scale and provides film uniformity. However, other deposition techniques known in the art may be used to deposit a series of film layers on substrate 102.

Next, in step 12, a photolithography technique may be used to create trenches in alternate film layers 104. Depending on the film layer, a dry etch or a wet etch process may be used to selectively etch at least one layer of alternate film layer 104 (step 14), creating vertical features of, for example, sub-100 nm.

Figure 2:
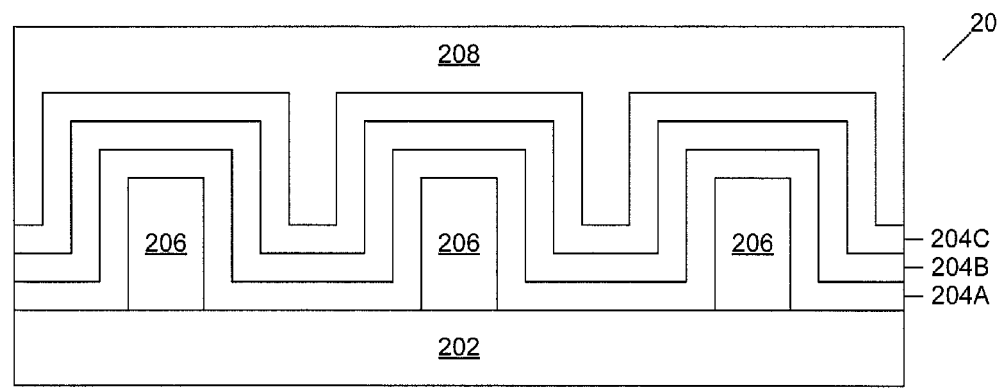
FIG. 2 is a flowchart of a method for fabricating nano features, in accordance with embodiments of this disclosure.
Figure 2:
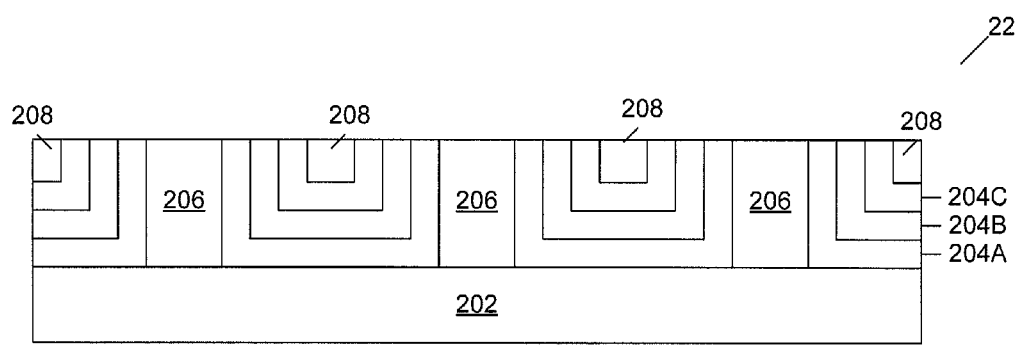
Figure 2:
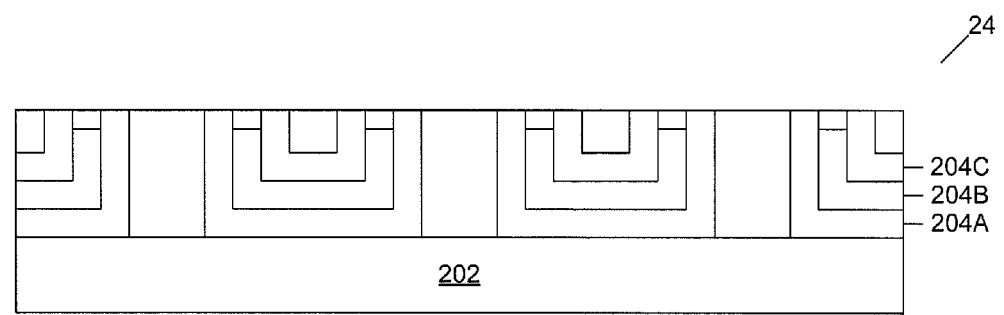

Referring to FIG. 2, a method for fabricating an imprinting mold is shown. In step 20, a silicon layer may be grown on substrate 202. The silicon layer may be an amorphous silicon layer. Alternatively, the silicon layer may be a poly silicon layer. Next, a lithography technique may be used to etch the silicon layer to form deep and wide trenches, leaving silicon pillars 206.

Next, multiple film layers may be deposited onto on the substrate and silicon layers, using, for example, an atomic layer deposition method to form film layers 204. The deposition thickness of the each layer of the film layers may depend on the needed width and pitch of the imprint. As shown in FIG. 2, first film layer 204A, second film layer 204B, and third film layer 204C may be deposited (collectively referred to as film layers 204). It is noted that the number of film layers may vary depending on the application of the mold.

In one embodiment, first film layer 204A and 204C may include, without limitation, $HfO_2$, $HfSiO_2$, or a physical vapor deposition (PVD) silicon material. Second film layer 204B may include, without limitation, an ALD TiN or TaCN layer. Alternative, second film layer 204B may include a PVD TaN layer. In some respects, second film layer 204B may include the same material as third film layer 204C.

After the deposition of film layers 204, a silicon layer 208 may be deposited on film layer 204 as a cap, as shown in step 20. The silicon layer may be an amorphous silicon layer. Alternatively, the silicon layer may be a poly silicon layer.

In step 22, a chemical mechanical polishing (CMP) technique may be used to expose all the vertical edges of film layers 204. In some respects, the CMP technique may be used to open up and remove the laterally aligned film layer 204 by removing portions of silicon pillars 206, and silicon layer 208. Alternatively, silicon pillars 206 and silicon layer 208 may remain in place.

In step 24, an etching process may be used to etch at least one layer of etch film layers 204 to distribute nano-scale patterns. In one embodiment, the etching process may include a wet etch. Alternatively, the etching process may be a dry etch. As seen in FIG. 2, second film layer 204B is etched, although, it is noted that film layer 204A and/or 204C may be etched.

Figure 3:
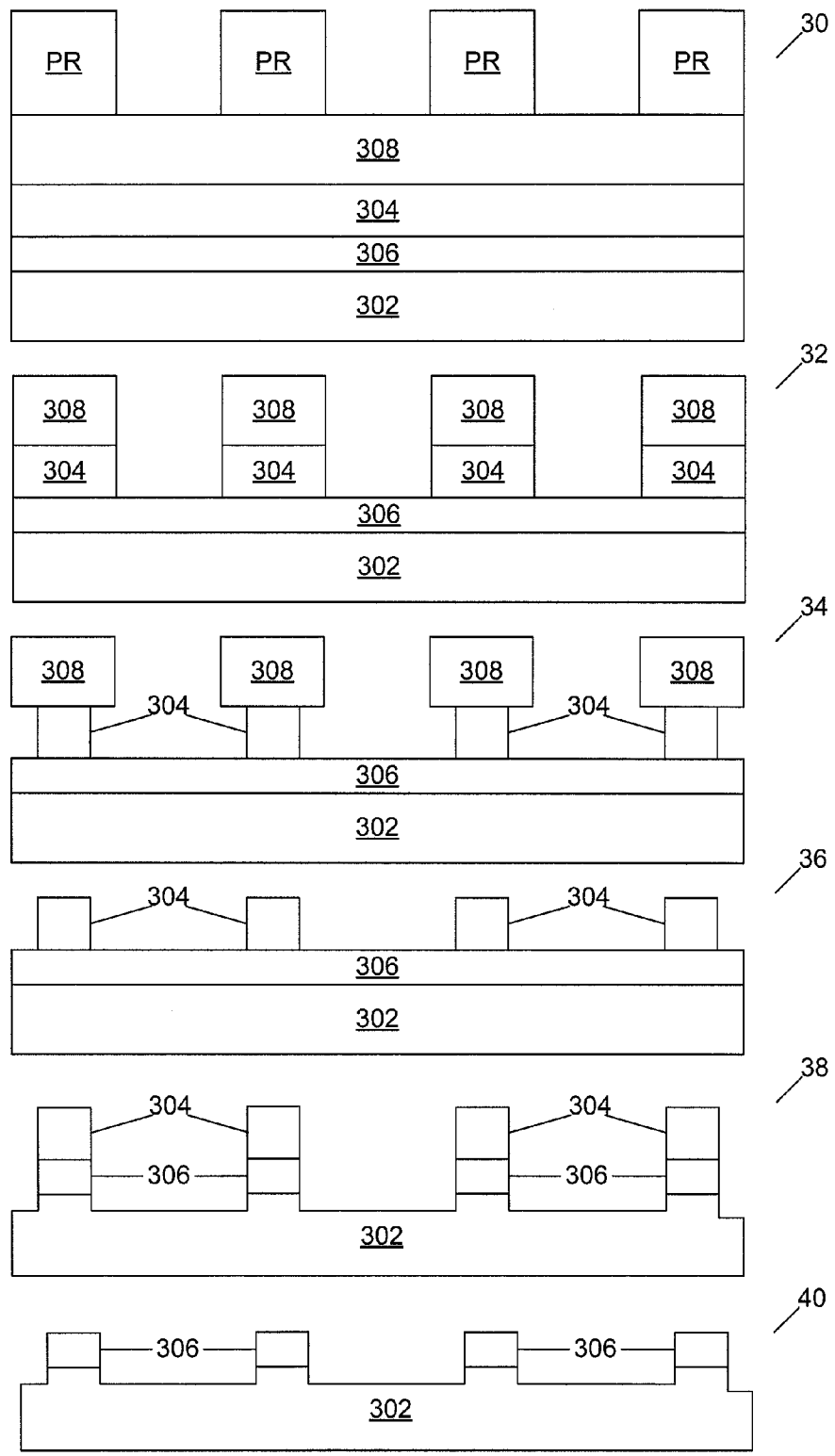
FIG. 3 is a flowchart of a method for fabricating nano features, in accordance with embodiments of this disclosure.

Referring to FIG. 3, a method for fabricating an imprint mold is shown, according to embodiments of the disclosure. In step 30, insulator layer 306 may be deposited on substrate 302. Insulator layer 306 may be, for example, a dielectric film such as a high-k dielectric film. Alternatively, insulator layer 306 may be a silicon dioxide ($SiO_2$) layer or silicon nitride ($SiN_x$) layer.

Next, film layer 304 may be deposited on insulator layer 306 using, for example, an ALD technique followed by the deposition of silicon layer 308. In one embodiment, film layer 304 may be a metallic film and silicon layer 308 may be an amorphous silicon layer. Alternatively, film layer 304 may include ALD TiN or TaCN, a PVD TaN, di-nitride ($N_2$), TaSiN, or more generally, metallic alloys, pure metals, elemental metals or dielectric films.

In step 32, a photolithography and reactive ion etching process, selective to sacrificial insulator layer 306, may be used to create trenches. In one embodiment, a photoresist layer (denoted as "PR" in the steps shown in FIG. 3) may be deposited on silicon layer 308, and subsequently patterned, as shown in step 32. Next, in step 34, an etching process may be used to undercut film layer 304 to a desired pattern. In one embodiment, the etching process may include a wet etch. Alternatively, the etching process may include a dry etch process or other techniques known in the art. Next, a dry etch process or a wet etch chemistry, such as hydroxide based chemistry (e.g., $NH_4OH$) may be used to silicon layer 308.

Using film layer 304 as a masking layer, an etching process such as dry etch process may be used to etch insulator layer 306 and a portion of substrate 302 to a desired depth, as shown in steps 36 and 38. In step 40, film layer 304 may be removed using techniques known in the art, leaving a uniform nanoscale feature that can be used as an imprinting mold.

Figure 4:
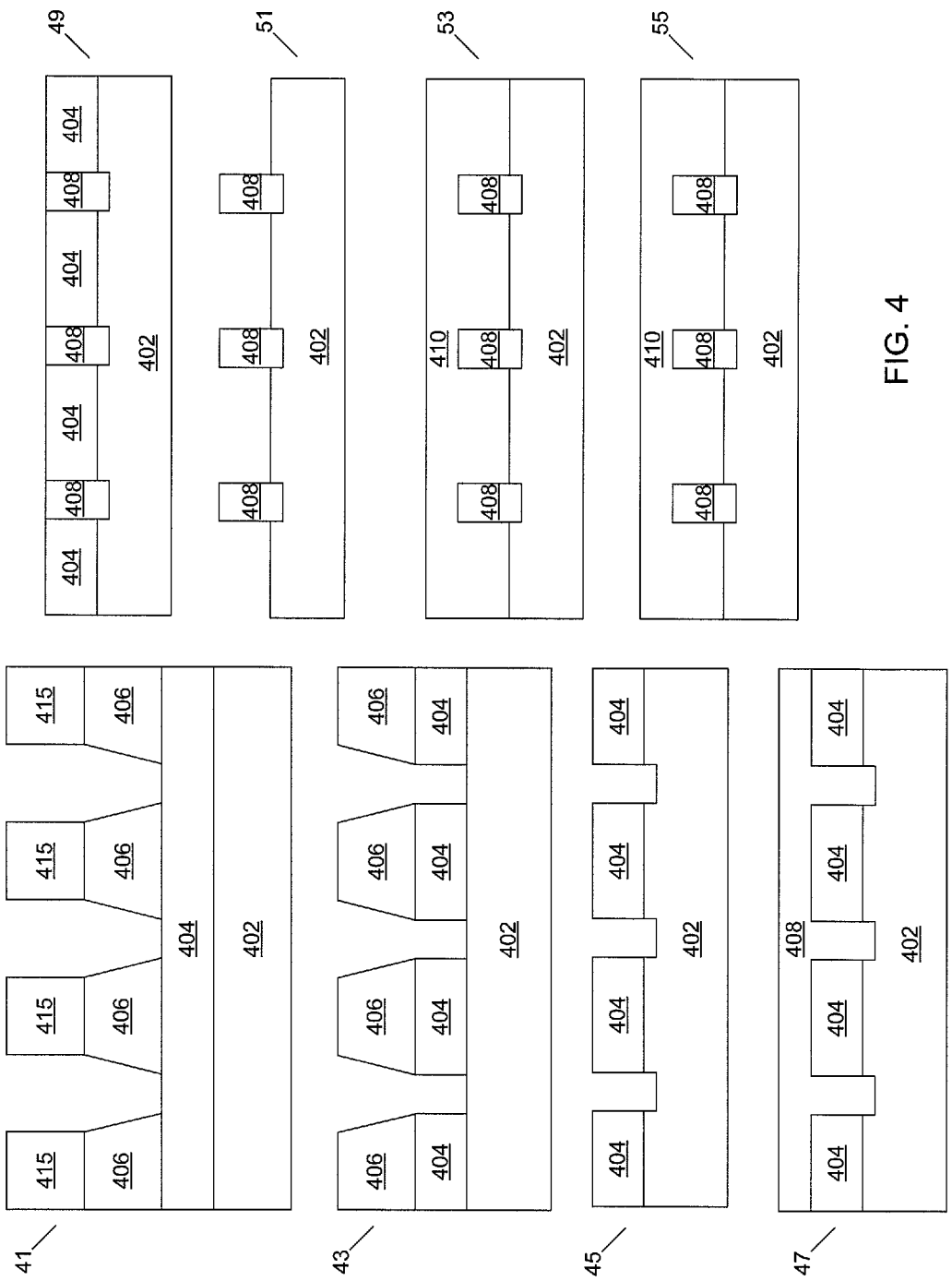
FIG. 4 is a flowchart of a method for fabricating nano features, in accordance with embodiments of this disclosure.

In other embodiments, an imprint mold may be fabricated using hydroxide based etch chemistry anisotropy effect on a single crystal silicon, as shown in FIG. 4. Hydroxide based etch chemistry, such as, but not limited to, KOH, $NH_4OH$, or NaOH etches a plane of a single crystal silicon faster then the 55° tilted (111) plane, and therefore, inverted pyramid shapes may be formed on the film. In one embodiment, by controlling the etch time and lithographic mask area, the area of the bottom surface area of these pyramids are controlled. Therefore, nanoscale square areas are formed on the top single crystal silicon surface of an SOI wafer.

In step 41, substrate 402 may include first layer 404 and silicon layer 406. In one embodiment, first layer 404 may be $SiO_2$ or $SiN_x$ and silicon layer 406 may include a single crystalline material. Using a hydroxide based chemistry, selective to first layer 404, i.e., an alkaline wet etch may be used to etch silicon layer 406 and open an anisotropic feature where the controlled etch may result in a small bottom surface area. In one respect, hardmask 415 (e.g., nitride, silicon nitride, silicon oxide, silicon dioxide, etc.) may be deposited and patterned, as shown in step 41. Areas of silicon layer 406 not protected by the hardmask or photoresist layer 415 may be etched.

In step 43, an etching process, i.e., a dry etch process may be performed to create deep trenches in first layer 404. In some embodiment, the etching process of step 43 may be used to etch a portion of substrate 402 (step 45). Step 45 also provides for removing silicon layer 406 using techniques know in the art.

In step 47, second film layer 408 may be deposited in the trenches between first layer 404 and on top of first layer 404 using, for example, an ALD technique. A CMP technique may be used to remove a portion, i.e., a lateral portion of second film layer 408 may be removed, exposing first layer 404, as seen in step 49. Next, first layer 404 may be removed using an etchant selective to second film layer 408 and substrate 402, as shown in step 51. In one embodiment, the etching process may include a dry or wet etch chemistry. The resultant structures leaving a second film layer 408 to be may be used as a mold For nano fluidic devices, such as nano fluidic channels, after step 51, third layer 410 may be deposited on top of on the resultant structure of step 49, as seen in step 51. Second layer 408 may include, without limitation, an ALD film such as TiN or TaCN. In one embodiment, third layer 410 may be a capping layer for the vertically deposited ALD layer 408. Using conventional techniques, a plurality of trenches may be formed. Next, the ALD film 408 may be removed, using, for example, wet etch or dry etch.

Figure 5:
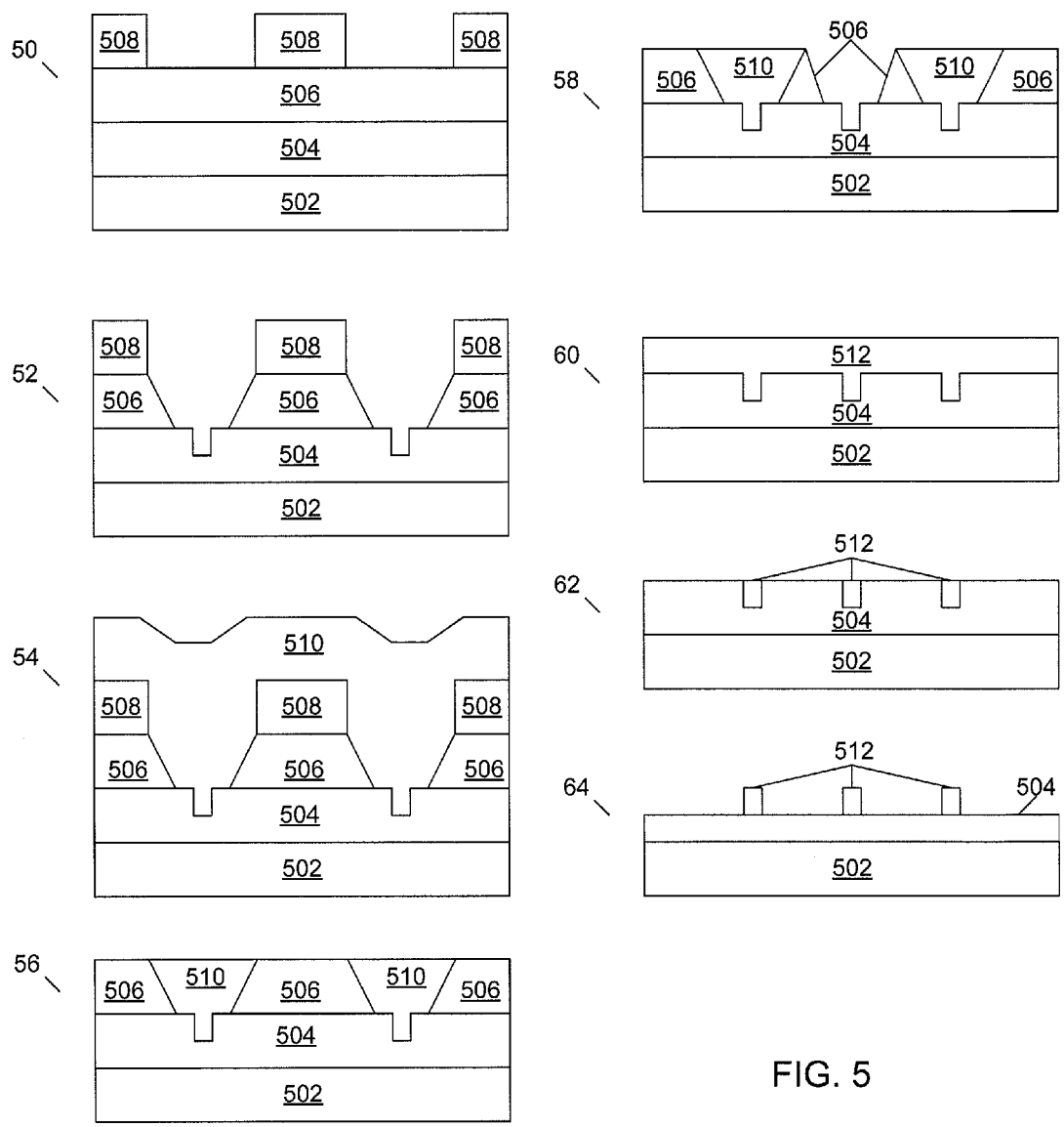
FIG. 5 is a flowchart of a method for fabricating nano features, in accordance with embodiments of this disclosure.

Referring to FIG. 5, a method for fabricating an imprint mold according to embodiments of the disclosure is shown. In one respect, substrate 502 including first silicon layer 504 (e.g., $SiO_2$ layer or SiN layer) and silicon layer 506 (e.g., a single crystalline material layer) may be provided. Next a hardmask material, e.g., nitride, silicon nitride, silicon oxide, or silicon dioxide, preferably silicon nitride ($SiN_x$) may be deposited and patterned to form hardmask 508.

Using an hydroxide based etch chemistry, selective to first layer 504, i.e., an alkaline wet etch, portions of silicon layer 506, and in particular, portions of 506 not protected by a hardmask layer 508 may be etched, as shown in step 52. Alternatively, the etching technique may be controlled to etch a portion of underlying layer 504.

In step 54, a material similar to the material used to form hardmask layer 508 may be deposited on the entire surface of substrate 502 to form layer 510. In some respect, layer 510 may include the same materials as hardmask layer 508. In other respects, layer 510 and hardmask layer 508 may include separate and distinct silicon layers.

Using a chemical mechanical polishing (CMP) technique, layers 508 and 510 may be polished to form a planarized surface, as shown in step 56. Next, in step 58, using an orientation dependent wet etching technique or a dry etching technique, a portion of layer 506 may be etched. Similarly layer 504 may be etched using, for example, a dry or wet etch process.

Next, in step 60, a wet or dry etching technique may be used to remove the remaining portions of layers 506 and 510. Subsequently, metal layer 512 may be deposited using, for example, filament evaporation, electron-beam evaporation, flash evaporation, induction evaporation, sputtering, direct metal deposition (DMD), atomic layer deposition, vapor deposition, plasma sprays, or other conventional techniques known in the art.

In step 62, metal layer 512 may be planarized using, for a CMP technique. Next, in step 64, an oxide etching process may be used to etch back a portion of layer 504, leaving resultant structure that may be used as, for example, a metallic mold or nanowire.

The following examples are included to demonstrate a specific embodiment of this disclosure. It should be appreciated by those of ordinary skill in the art that the techniques disclosed in the examples that follow represent techniques discovered by the inventors to function well in the practice of the invention, and thus can be considered to constitute specific modes for its practice. However, those of ordinary skill in the art should, in light of the present disclosure, appreciate that many changes can be made in the specific embodiments which are disclosed and still obtain a like or similar result without departing from the spirit and scope of the disclosure.

The techniques of the present disclosure may used to achieve nano-scale features for several different applications. In one respect, the present disclosure provides techniques that may be used to achieve nano-scale features in semiconductor devices, photonic devices, biological devices, fluidic devices, organic storage, polymer devices, or even electro mechanical systems.

Fabricating FINFETS

For example, current techniques to create the fins such as electron beam lithography are slow, expensive and do not meet industry standards. Similarly, spacer image transfer techniques fail to provide a uniform film after the etching steps. The techniques of the present application may be use to form the fin structures of a FINFET. In one respect, the techniques of the present disclosure may be used to form fin structures in a vertical manner. Additionally, the techniques can provide an accurate position and pitch controls for the fins and a have smoothness and vertical profile control of the fins.

Figure 6A:
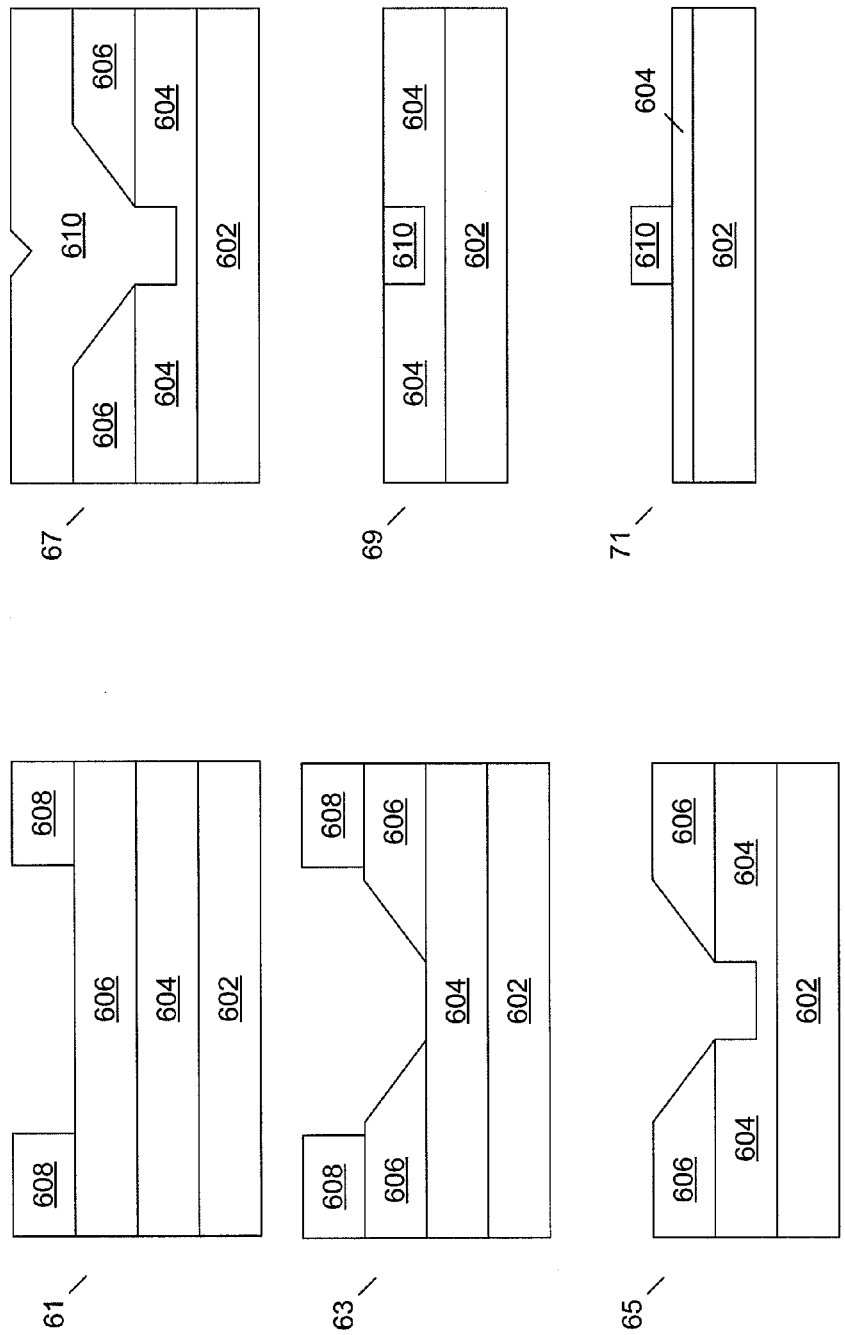
FIGS. 6A and 6B are flowcharts of a method for fabricating a fin structure, in accordance with embodiments of this disclosure.

Referring to FIG. 6A, similar to step 50 of FIG. 5, a substrate 602 including first silicon oxide layer 604 (e.g., $SiO_2$) and silicon layer 606 including, a single crystalline material is provided. Next a hardmask material, e.g., nitride, silicon nitride, silicon oxide, or silicon dioxide, preferably silicon nitride ($SiN_2$), may be deposited and patterned to form hardmask 608.

In step 63, using, for example, a selective wet chemical based orientation dependent etch, exposed portions of layer 606 not protected by hardmask layer 608 may be etched. In some respect, the etching process may stop on the buried oxide layer 604. Hardmask layer 608 may subsequently be removed using conventional techniques known in the art.

In step 65, using silicon layer 606 as a mask, a portion of silicon oxide layer 604 may be etched. Next, in step 67, silicon layer 610 may be selectively epitaxially grown on the resultant structure of step 65. In one respect, silicon layer 610 may include the same material as silicon layer 606.

Using a chemical mechanical polishing (CMP) technique, layers 606 and 610 may be planarized, and the resultant structure is shown in step 69. In step 71, oxide layer 604 may be etched, resulting in a silicon FIN structure. The structure shown in step 71 may be used in conventional fabrication techniques to from a FINFET.

Figure 6B:
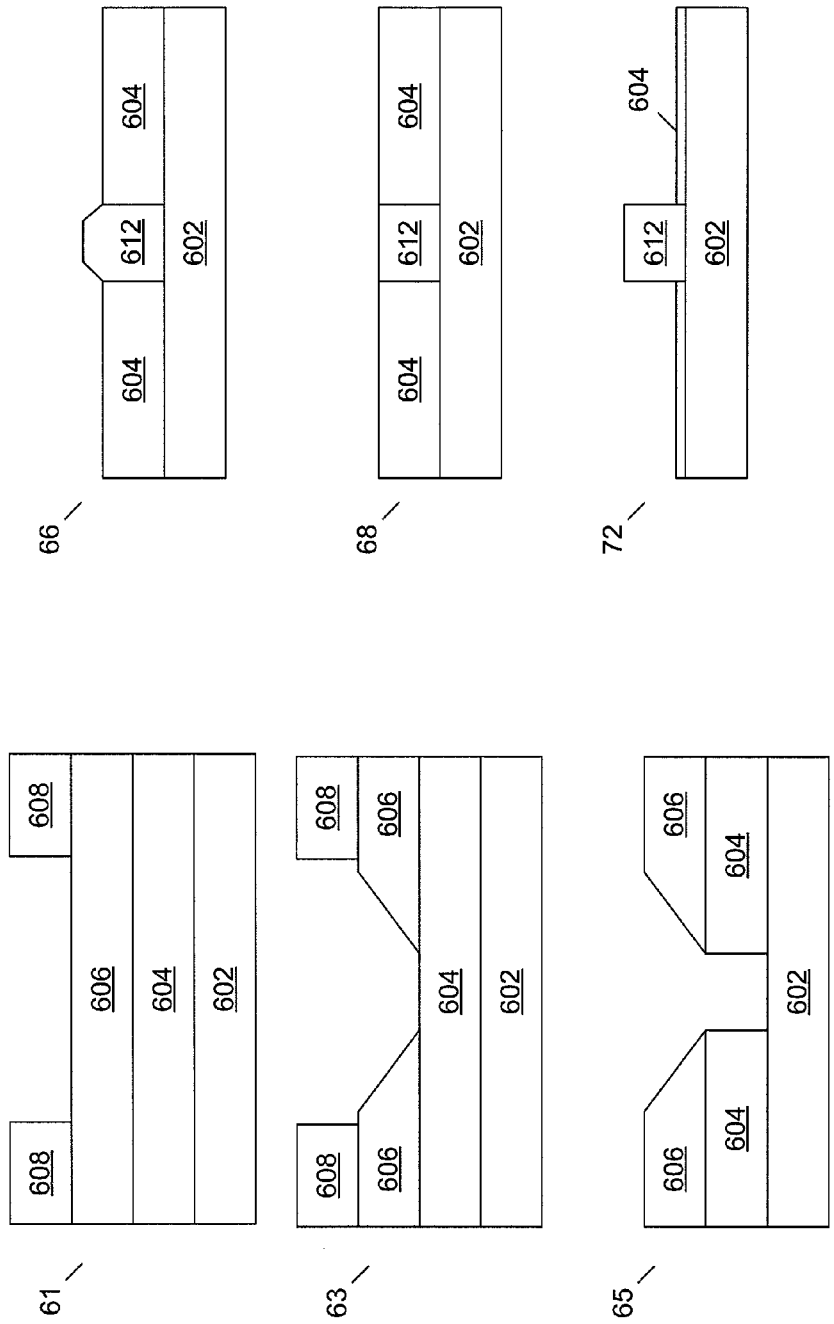

Alternatively, in other respects, a fin structure may be formed using the techniques shown in FIG. 6B. Steps 61 through 65 are similar to the steps shown in FIG. 6A. However, instead of epitaxially growing a silicon layer on the resultant structure of step 65, in step 66, silicon layer 606 is removed using techniques known in the art.

Next, a silicon layer 612 is epitaxilly grown in a vertical manner from substrate 602 and subsequently planarized using, for example, a CMP technique, as shown in steps 66 and 68, respectively.

In step 70, oxide layer 604 may be etched, resulting in a silicon FIN structure. The structure shown in step 71 may be used in conventional fabrication techniques to from a FINFET.

Fabricating Nanowires

The techniques of the present disclosure may be used to fabricate, amongst other things, nanowires. In one respect, a set of 200 mm (100) SOI wafers having a silicon layer of about 60 nm in thickness was provided. Next, silicon nitride was deposited as a hardmask on the SOI wafers. An already available photo mask was then used to transfer line patterns on the nitride hardmask using conventional photolithography and a positive resist. Dry etch selectively removed silicon nitride from the exposed area. The minimum line width of the opaque region on the mask was 100 nm. The minimum pitch width was 200 nm, thus providing the fabrication of about sub-20 nm nanowires. It is noted that other photo mask with other minimum line width may be used to make nanowires of less than or greater than 20 nanometers.

Figure 7:
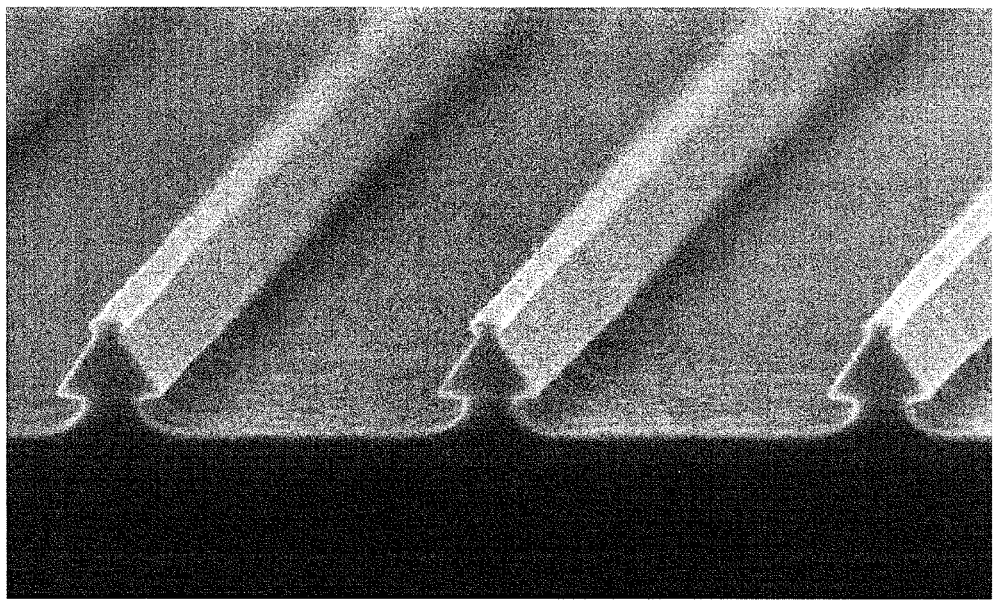
FIG. 7 is a cross section of nanowires, in accordance with embodiments of this disclosure.
Figure 8:
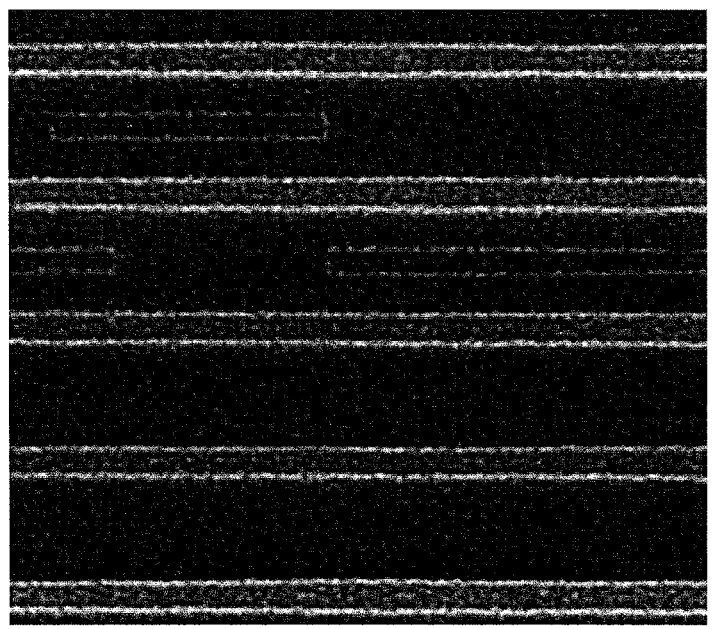
FIG. 8 is a cross section of nanowires, in accordance with embodiments of this disclosure.

After removing the nitride, an OH-based chemistry, such as 45% potassium hydroxide (KOH), 25% tetra methyl ammonium hydroxide (TMAH), or 29% ammonium hydroxide ($NH_4OH$) was used to exposed silicon. Historically, these chemistries etch the (111) plane on silicon more slowly than the (100) planes. Their etch characteristics form a V-grove mesa where the inclined angle of the (111) plane with the (100) plane is around 55° (as shown, for example, in step 41 of FIG. 4, step 52 of FIG. 5, or step 63 of FIG. 6). The unique etch characteristics of an OH-based chemistries on silicon to define the bottom layer can determine the desired nanowire width defined as $$w = l - 2t/\tan 55$$  Eq. 1 where w is the nanowire width, l is the length of the exposed silicon by photolithography, and t is the thickness of silicon. Due to a large pitch area in the initial photo mask, the fabricated nanowires were about 125 nm wide (FIG. 7) after an unoptimized vapor phase HF etch process (FIG. 8).

After the silicon etch, the remaining silicon nitride was removed with a hot (about 170° C.) phosphoric acid ($H_3PO_4$) and then applied a HF-based vapor phase etch to selectively remove 20 nm of oxide, using the top silicon layer as a hardmask. This vapor HF causes about 10 nm of undercutting. In some embodiments, a selective dry etch process can be used and may provide a more uniform vertical profile. Further, the trench depth in the oxide can be chosen depending on the requirement.

The remaining top silicon was then etched completely. After silicon etching, metallic films were deposited to fill up the trenches. Because a chemical mechanical polishing (CMP) step follows, the film had to be deposited to avoid dishing in the trench areas, which is usually caused by CMP. After CMP, which removed the non-required metallic films on top of the un-etched oxide layers, a final oxide etch was done, which formed an accurately aligned metallic nanowire pattern throughout the entire wafer.

The methods of the present disclosure can also be used to slow the etch rate on (110) planes with OH-based chemistries and isopropyl alcohol where the nanowires aligned in the (110) direction on (100) wafers. The techniques can also be used on regular silicon wafers with additional processing steps like oxide growth on both sides of the silicon wafer before depositing the nitride hardmask. After forming the nanowires, oxidization and etching of the oxide layers or hydrogen annealing can make the nanowires thinner.

A common problem in current nanopatterning technique is crossing the nanowires without going through a stack. The methods of the present disclosure provide a suitable mask can resolve this problem.

The methods of the present disclosure also have a minimum number of photolithography steps. For example, even in straight-line patterns, a single step is sufficient to grow the desired nanowires. An intelligent choice of silicon thickness and the mask set give the grown nanowires the desired pitch. Since batch fabrication was used to process the nanowires in an industrial class 1 clean room, the method shows its robustness and readiness for industry-scale production. Also, batch fabrication proves the nanowires are reliably reproducible.

The use of classical microfabrication techniques currently available makes the techniques of the disclosure simple, economical, and expedient process. Accurately aligned patterning on the oxide layer allows the flexibility to deposit any thin film. The emergence of various metallic nanowires such as tantalum, tungsten, ruthenium, or titanium nitride illustrates this advantage.

Isotropic Etched Based Chemistry for Fabricating Nanowires

Isotropic dry etch, a concept analogous to isotropic wet etch process, is a simple and inexpensive technique for transferring a pattern defined by a physical mask. Typically, a metal film is oxidized selectively to a soluble (usually ionic) form by a strong acid or an oxidizing agent. Polycrystalline metal films can be etched isotropically and yield structures with rounded sidewalls. The profile of the sidewall is sensitive to the temperature and composition of the etch chemistry, and to the adhesion between the mask pattern and the metal film. For high-aspect ratio structures, the variation in rates of etching makes it difficult to reproduce features across wide areas. Undercutting by an isotropic etch in thick films is undesirable in general since the sidewalls of the etched structures are curved, and since it is difficult to define the width of the substrate that is exposed.

Figure 9A:
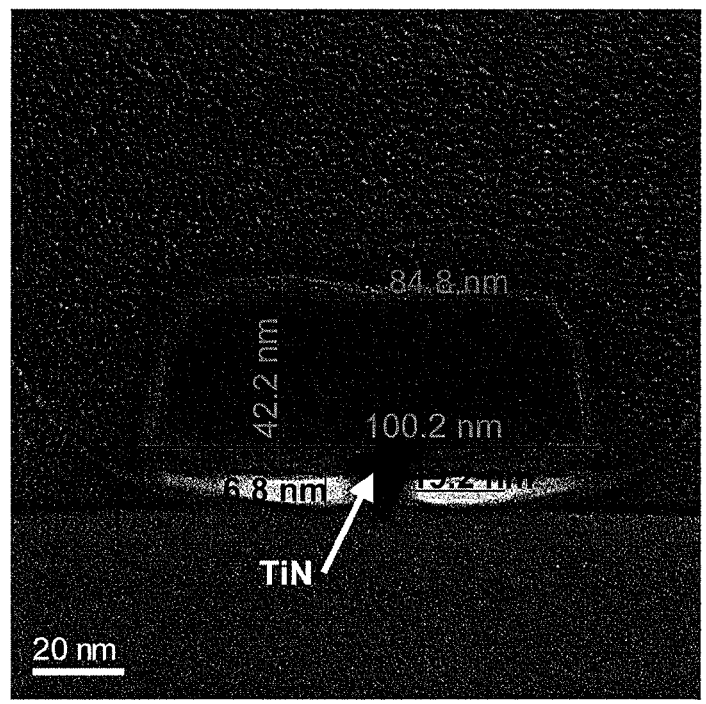
FIGS. 9A and 9B are TEM images of titanium nitride metallic film, in accordance with embodiments of this disclosure.
Figure 9B:
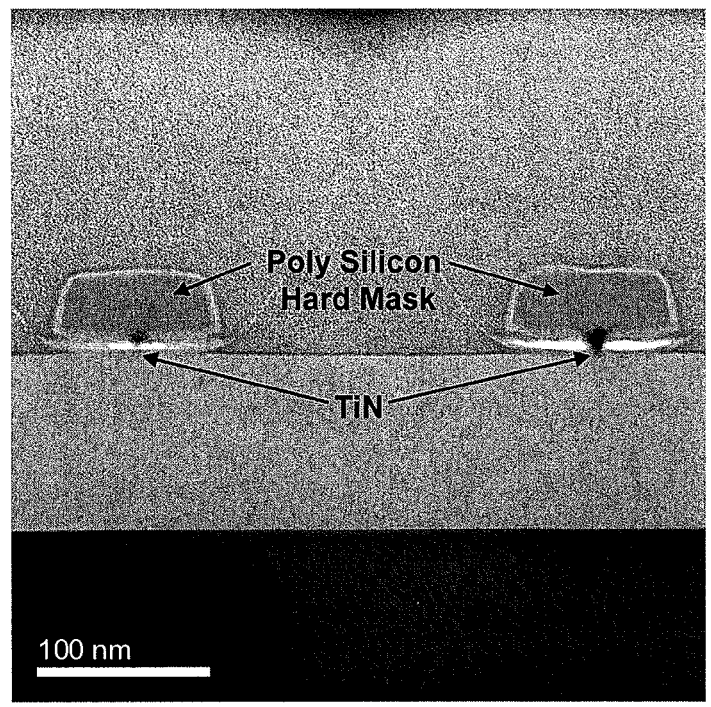

In this context, the present disclosure provides a highly selective isotropic dry etch to fabricate thin film nanostructure-like wires. Previously, isotropic wet etch based nanoscale patterning have been demonstrated. However, those methods did not show simply undercutting based direct fabrication of metallic nanowires. In accordance to embodiments of the disclosure, about 40 nm of a poly silicon hardmask was deposited on top of about 20 nm titanium nitride metallic alloy film by atomic layer deposition (ALD) technique. An available photo mask then was used to transfer line patterns on the silicon hardmask using conventional photolithography and a positive resist. A $Cl_2$ and HBr gas mixture was used to etch the poly silicon layer anisotropically stopping on titanium nitride film. Titanium nitride layer was then removed isotropically using $Cl_2$ and $BCL_3$ plasma discharge with no bias power. This timed process showed a high degree of selectivity to the poly hardmask and underlying oxide as shown in FIGS. 9A and 9B. At the end of this selective isotropic timed dry etch process, the silicon hardmask was removed with 29% $NH_4OH$ without affecting the underneath titanium nitride metallic nanowires or the bottom oxide layer.

Figure 10A:
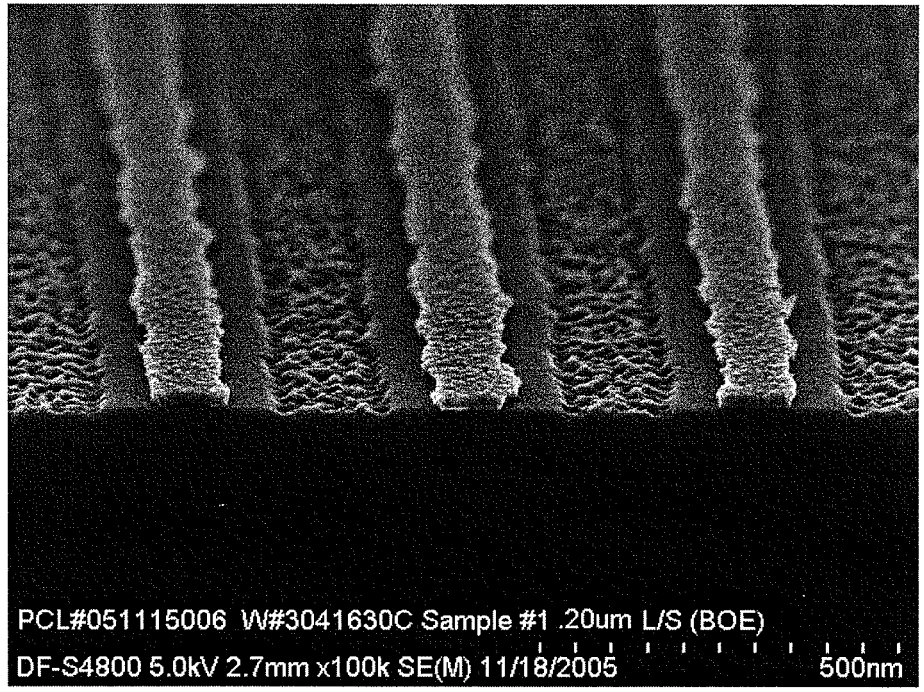
FIGS. 10A and 10B are SEM images of titanium nitride nanowire patterns, in accordance with embodiments of this disclosure.
Figure 10B:
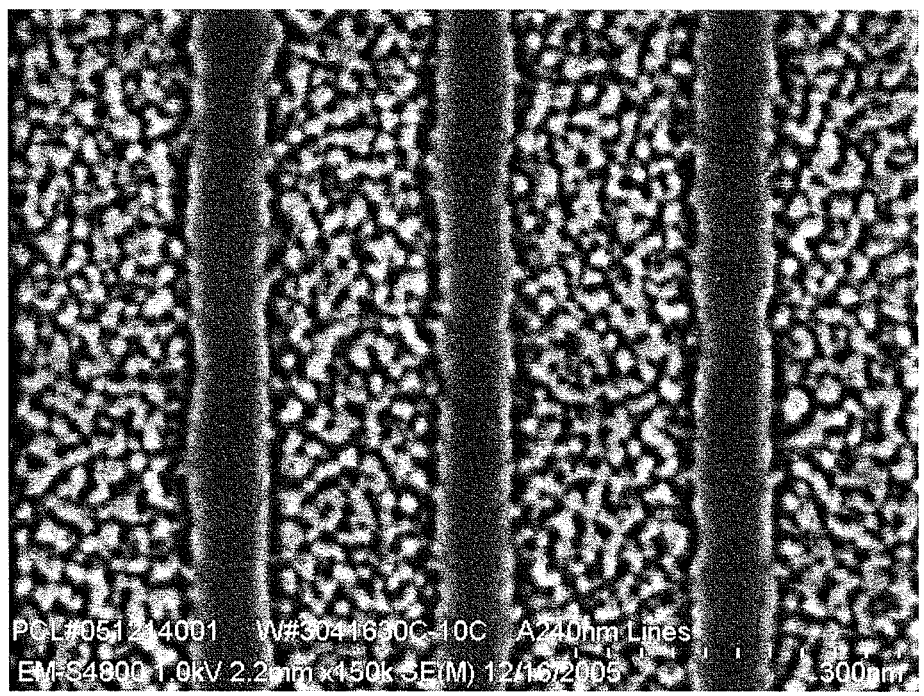

Removal of silicon hardmask exposes patterned titanium nitride nanowires of about 60 nm. Referring to FIG. 10A, the bottom oxide layer under the titanium nitride nanowires was protected due to the poly silicon mask over the nanowires. However, as shown in FIG. 10B, if the high selectivity is not maintained then the oxide layer can be damaged. The roughness of the film correlates to the grain size of the film.

Figure 11A:
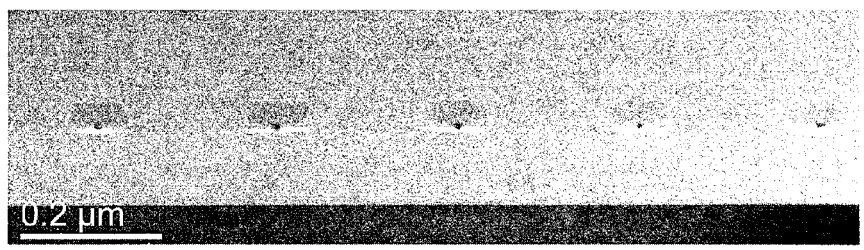
FIG. 11 is a SEM image of silicon fins patterned using patterned titanium nitride hardmask, in accordance with embodiments of this disclosure.
Figure 11B:
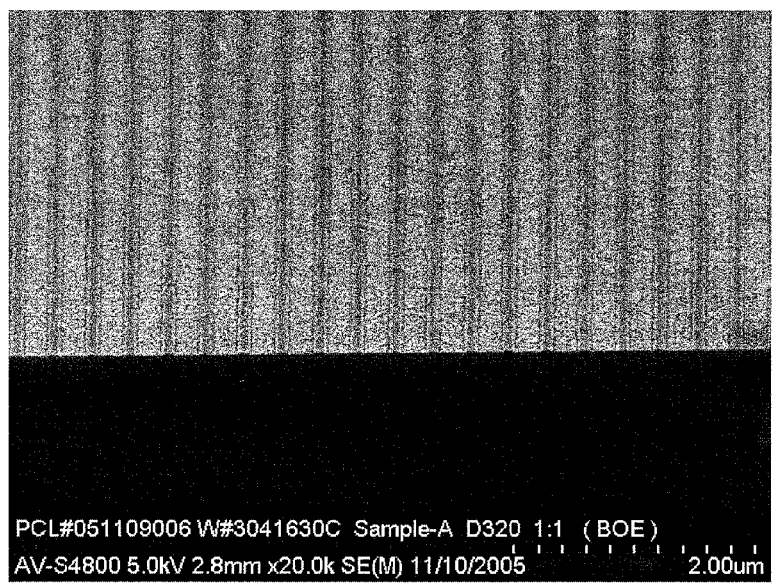
Figure 12:
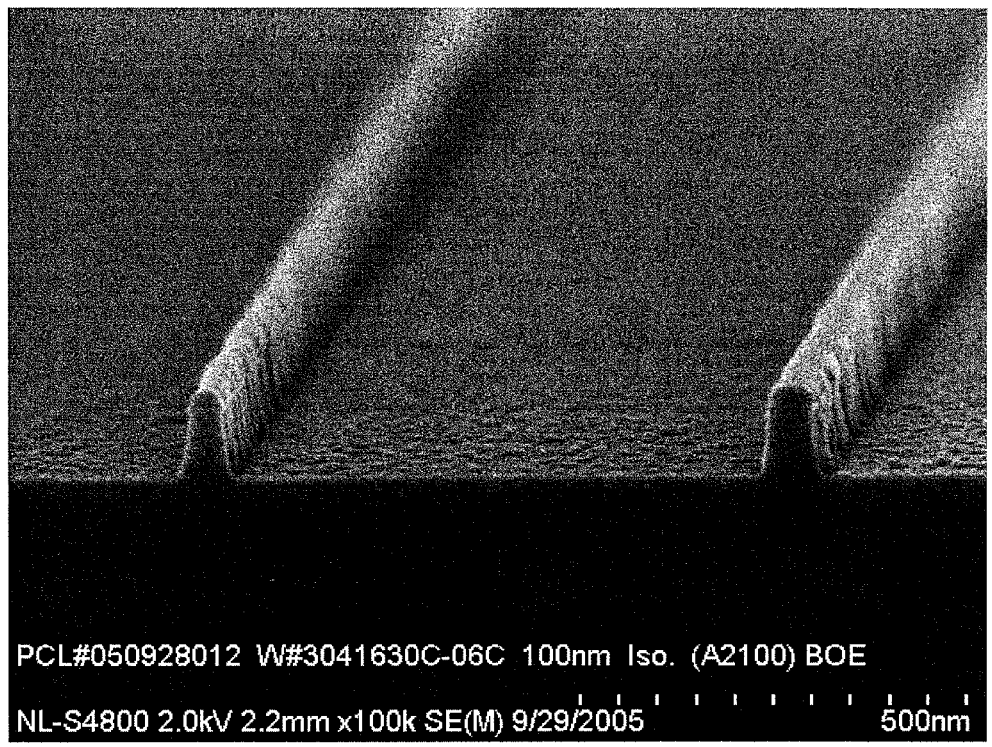
FIG. 12 is a SEM image of uniform batch-fabricated titanium nitride nanowires, in accordance with embodiments of this disclosure.

Further reduction in the nanowire width can be done with annealing or a combination of metal oxidization and etching. The uniformity of the nanowire patterns is shown in FIGS. 11A and 11B. As an extension of this work, patterned nanowires can be used as a hardmask to transfer this pattern on to the bottom oxide layer and then on to the silicon substrate to fabricate FinFETs (FIG. 12). More process optimization can give us desired size and smooth surfaced silicon patterns.

In summary, the example illustrates batch fabricated uniform titanium nitride metallic nanowire patterns using highly selective, timed, isotropic dry etch. Since dry etch is inherently faster and anisotropic, it therefore may be a better option for more vertical wall in high aspect ratio structures than that of isotropic wet etch based undercutting. Industrial class 1 clean room production with sufficient time interval on various wafers exemplifies the method's reproducibility. Also, use of conventional technique like etch based undercutting makes it a simple process.

The methods of the present disclosure may be suitable for fabrication process which is not sensitive to edge geometry or defects. Also, the method can be used for pattern definition for vertical nanowire growth.

All of the methods disclosed and claimed can be made and executed without undue experimentation in light of the present disclosure. While the methods of this invention have been described in terms of embodiments, it will be apparent to those of skill in the art that variations may be applied to the methods and in the steps or in the sequence of steps of the method described herein without departing from the concept, spirit and scope of the invention. All such similar substitutes and modifications apparent to those skilled in the art are deemed to be within the spirit, scope, and concept of the disclosure as defined by the appended claims.

The invention claimed is:

1. A method, comprising:
   providing a structure comprising:
      a substrate;
      a first layer formed on a surface of the substrate;
      a silicon layer formed on a surface of the first layer, the silicon layer comprising single-crystalline silicon; and
      a first mask layer formed on a surface of the silicon layer;
   patterning the first mask layer to expose a first exposed region on the surface of the silicon layer;
   etching the silicon layer in the first exposed region with an hydroxide-based etch chemistry to expose a second exposed region on the surface of the first layer; and
   etching the first layer in the second exposed region to form a first trench in the first layer.

2. The method of claim 1, wherein the hydroxide-based etch chemistry etches the silicon layer along a tilted (111) plane.

3. The method of claim 1, wherein the hydroxide-based etch chemistry etches the silicon layer at a 55° angle.

4. The method of claim 1, further comprising etching through the first layer into a portion of the substrate to form a trench in the substrate.

5. The method of claim 1, further comprising removing the first mask layer.

6. The method of claim 1, further comprising removing the silicon layer.

7. The method of claim 1, further comprising depositing a second film layer in the first trench in the first layer.

8. The method of claim 7, wherein:
   the second film layer and the substrate are separated by a first portion of the first layer; and
   a second portion of the first layer is removed to expose the second film layer.

9. The method of claim 7, wherein:
   the second film layer contacts the substrate; and
   at least a portion of the first layer is removed to expose the second film layer.

10. The method of claim 4, further comprising depositing a second film layer in the first trench in the first layer and the trench in the substrate.

11. The method of claim 10, further comprising selectively removing the first layer to form a mold comprising the deposited second film layer protruding from the surface of the substrate.

12. The method of claim 11, further comprising depositing a third layer on top of the mold.

13. The method of claim 12, further comprising removing the second film layer to form a fluidic channel through at least a portion of the substrate and at least a portion of the third layer.

14. The method of claim 1, further comprising depositing a second mask layer over the substrate, including in the first trench formed in the first layer.

15. The method of claim 14, further comprising polishing the first mask layer and the second mask layer to approximately the surface of the silicon layer.

16. The method of claim 15, further comprising etching the silicon layer in a third region with an hydroxide based etch chemistry to expose a fourth exposed region on the surface of the first layer.

17. The method of claim 16, further comprising etching the first layer in the fourth exposed region to form a second trench in the first layer.

18. The method of claim 17, further comprising removing the first mask layer and the second mask layer.

19. The method of claim 18, further comprising filling the first trench and the second trench with a metal layer.

20. The method of claim 19, further comprising removing at least a portion of the first layer to expose the metal layer.

* * * * *